United States Patent
Kim et al.

(10) Patent No.: US 6,297,128 B1
(45) Date of Patent: *Oct. 2, 2001

(54) PROCESS FOR MANUFACTURING SHALLOW TRENCHES FILLED WITH DIELECTRIC MATERIAL HAVING LOW MECHANICAL STRESS

(75) Inventors: Hyeon-Seag Kim, Sunnyvale; Sunil D. Mehta, San Jose, both of CA (US)

(73) Assignee: Vantis Corporation, Sunnyvale, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/240,560

(22) Filed: Jan. 29, 1999

(51) Int. Cl.$^7$ .................................................. H01L 21/76

(52) U.S. Cl. .................... 438/437; 438/424; 438/435; 438/436

(58) Field of Search .................... 438/424, 435, 438/436, 437

(56) References Cited

U.S. PATENT DOCUMENTS

| | | | |
|---|---|---|---|
| 4,835,115 | * | 5/1989 | Eklund . |
| 5,254,873 | * | 10/1993 | Poon et al. ........................ 257/751 |
| 5,913,125 | * | 6/1999 | Bro . |
| 6,037,237 | * | 3/2000 | Park et al. ........................ 438/424 |
| 6,090,714 | * | 7/2000 | Jang et al. ........................ 438/692 |

OTHER PUBLICATIONS

Damiano, et al., "Characterization and Elimination of Trench Dislocations," *1998 Symposium on VLSI Technology Digest of Technical Papers*, IEEE, pp. 212–213.

Ishimaru, et al., "Mechanical Stress Induced MOSFET Punch–through and Process Optimization for Deep Submicron TEOS–O$_3$ Filed STI Device," *Symposium on VLSI Technology Digest of Technical Papers*, pp. 123–124.

Park, et al., "Stress Minimization in Depp Sub–Micron Full CMOS Devices by Using an Optimized Combination of the Trench Filling CVD Oxides," *IEDM 97–699, 1997 IEEE*, pp. 27.4.1–27.4.4.

* cited by examiner

*Primary Examiner*—Long Pham
(74) *Attorney, Agent, or Firm*—Fliesler, Dubb, Meyer & Lovejoy

(57) ABSTRACT

This invention provides methods for reducing the mechanical stresses within dielectric layers filling the gaps in shallow trench isolation (STI) regions on semiconductor wafers. The methods include the sequential deposition of alternating layers of dielectric materials having tensile stress and compressive stress, respectively. The invention also provides methods for adjusting the residual stress in a dielectric film by controlling the relative thicknesses of the alternating layers of dielectric material to provide bilayers having minimal overall stress. Additionally, the invention provides semiconductor devices having the reduced stress dielectric materials within the shallow isolation trenches of the semiconductor wafer. The reduction in stress within and between trenches decreases defects in the shallow isolation materials and thereby decreases source-drain and trench—trench short circuiting. The improved electrical and mechanical properties of the shallow trench filling materials makes practical the manufacture of more reliable, smaller semiconductor devices.

28 Claims, 2 Drawing Sheets

PROCESS FOR MANUFACTURING SHALLOW TRENCHES FILLED WITH DIELECTRIC MATERIAL HAVING LOW MECHANICAL STRESS

BACKGROUND OF THE INVENTION

1. Field of the Invention

This invention relates to methods of manufacturing semiconductor devices. Specifically, this invention relates to methods for reducing the mechanical stresses placed on semiconductor devices during manufacturing.

2. Discussion of Related Art

In the field of integrated circuit manufacture, the drive for increased performance and reduced cost leads to shrinking device dimensions and an increase in the density of semiconductor devices provided in a single chip. The reliability of semiconductor devices is dependent, in part, upon electrically isolating nearby semiconductor devices from one another. This increase in device density requires better and smaller insulation between active devices formed on a substrate.

One way of electrically isolating semiconductor devices from one another is by way of shallow trench isolation ("STI"). STI is typically formed by etching a shallow trench in the substrate between areas where active devices are to be formed, and thereafter typically filling the trenches with a dielectric material. The dielectric material acts as an insulator, electrically isolating active semiconductor devices formed on the remaining surface of the wafer. As the trenches are reduced in width, the width of the insulating material filling the trenches decreases. Nevertheless, the insulating capabilities of the dielectric material must remain high to maintain electrical isolation of adjacent devices. Unfortunately, as the width of the dielectric material narrows, the isolation can become less effective. This is due in part to the formation of defects within the dielectric layers which can result from mechanical and thermal stresses placed on the silicon and dielectric materials during STI manufacture.

Dielectric materials useful for STI include silicon oxides, such as tetraethylorthosilicate ("TEOS"), which can be deposited using a high temperature chemical vapor deposition (CVD) process in the presence of oxygen or ozone, a process herein termed "TEOS-$O_3$ CVD". The deposited TEOS layer can then be densified by annealing at a high temperature, such as 750° C. In general, however, TEOS-$O_3$ CVD films treated in this fashion exhibit tensile stresses, which can lead to pinhole defects, and poor electrical isolation. Moreover, even if deposition conditions favor low stress films, the above annealing process can result in a stressed film.

One proposed solution to the problem of TEOS-$O_3$ CVD stress is to perform the high-temperature annealing step at temperatures up to and including about 1200° C. (Ishimaru et al., *Mechanical Stress Induced MOSFET Punch-Through and Process Optimization for Deep Submicron TEOS-$O_3$ Filled STI Device, Symposium on VLSI Technology Digest of Technical Papers*:123–124 (1997); Damiano et al., *Characterization and Elimination of Trench Dislocations, Symposium on VLSI Technology Digest of Technical Papers:* 212–213 (1998); both reference incorporated herein in their entirety). The high-temperature annealing step can permit the realignment of misfits to form a more crystalline, denser structure, having less local stress and having better electrical isolating properties. Such high-temperature annealing processes can reduce the mechanical stress in the TEOS layer itself However, a STI TEOS-$O_3$ CVD layer also suffers from defects due to the presence of mechanical stresses between the TEOS and the surrounding silicon substrate. The stresses result in the formation of defects between source and drain and pin-holes in the STI, which can lead to source-drain short-circuiting, trench—trench short circuiting, poor electrical isolation and unpredictable device function.

One theory which may account for the formation of stress within a dielectric layer is that rapid addition of new silicon dioxide moieties to the growing film can lead to mis-aligned molecules, herein termed "misfits." A new reactive moiety can attach to the surface of the growing film. However, new moieties may not be in alignment with the existing film structure, which can lead to gaps between the moieties in the film. If a deposition rate is relatively low, there is opportunity for the newly added moieties to move around at the surface, and they can become aligned with the crystal structure of the film. Re-alignment can thereby decrease the number of gaps between moieties in the film. Further addition of new moieties can result in a similar attachment/realignment process thereby resulting in a dense, uniform film structure having good electrical isolation properties. However, with deposition rates sufficiently high, there can be less opportunity for newly attached moieties to re-align to the existing film structure. Upon attachment of additional moieties, the mis-aligned moieties can become trapped within the film.

With rapid deposition of moieties onto a film surface, the film can exhibit a compressive stress. A compressive stress is characterized by a tendency of atoms and molecules in the film to expand laterally in a direction parallel to the film surface. According to this theory, the formation of compressive stress can lead to a tendency for the film to buckle, a process which can lead to the formation of gaps in the film. When deposited in a shallow trench, a compressive or tensile film can lead to small scale stresses within the trench, termed "local stresses." Although this is one theory which could account for the poorer electrical isolation of stressed TEOS films, still other theories may account for the observations.

In addition to local stresses within shallow trenches, stresses can be created between different areas of a wafer. A compressive film in a shallow trench exerts a force against the walls of the trench, tending to expand the trench in an outward, or lateral direction. Compressive stress within the trench tends to expand the surface of the wafer in a direction parallel to the surface, which tends to warp the wafer. This type of larger scale stress is herein termed "global stress."

Another approach to reducing global stresses on a semiconductor wafer has been the filling the trench with TEOS-$O_3$ CVD oxide followed by a cap layer of high-density plasma CVD (HDPCVD) oxide. (Park et al. *Stress Minimization in Deep Sub-Micron Full CMOS Devices by Using an Optimized Combination of the Trench Filling CVD Oxides: IEEE* 1997:27.4.1 (1997), incorporated herein fully by reference). A HDPCVD oxide layer, can produce a film having compressive stress. According to the above theory, by providing a layer of film having compressive stress on the top of a TEOS-$O_3$ CVD layer having tensile stress, the global stress on the wafer can be reduced.

An example of this prior art approach to decreasing global stress is shown in FIG. 1. FIG. 1 shows a shallow trench in a silicon substrate which has filled with oxide according to the prior art. Device 100 comprises silicon substrate 104 within which two shallow trenches are shown. A layer of nitride 108 is depicted on the surface of the silicon substrate 104. A layer of first TEOS-$O_3$ CVD oxide 112 is shown filling substantially all of the gap in the shallow trench. A layer of HDPCVD oxide 116 is shown on the top of the first oxide layer 108. Note that the layer of HDPCVD oxide does not extend below the surface of the silicon substrate, does not extend within the shallow trench, and therefore cannot reduce the local stress within the shallow trench.

However, neither of the above processes adequately address the problems of mechanical stress deep within the shallow trenches themselves, and therefore do not minimize the overall stress on the semiconductor wafer after subsequent processing. The presence of continued stress in the shallow trenches can result in the formation of defects in the dielectric material during subsequent processing steps, leading to loss of electrical isolation and device failure.

Therefore, one object of this invention is the development of methods for producing STI with minimized mechanical stresses within the shallow trench.

Another object of this invention is the development of methods for producing STI with improved electrical insulating properties.

A further object of this invention is the development of methods for the production of semiconductor devices with high reliability.

A yet further object of this invention is the manufacture of semiconductor devices having improved electrical properties.

Another object of this invention is the manufacture of semiconductor devices with reduced mechanical stresses being introduced into STI during manufacture.

An further object of this invention is the manufacture of semiconductor devices having increased useful lifetimes.

SUMMARY OF THE INVENTION

Therefore, one aspect of this invention comprises manufacturing STI featuring layered structures comprising two oxides, one having a compressive stress, and another having a tensile stress. By providing alternating layers having compressive stress and tensile stress within the shallow trench, the local mechanical stresses within the trenches and between trenches are minimized, thereby resulting in the formation of trench filling materials with fewer pin-hole defects. Therefore, the shallow trench filling materials have improved electrical properties including decreased source-drain and trench—trench short circuiting, greater dielectric strength, and have improved mechanical properties which leads to longer useful lifetimes of the semiconductor devices made with the methods of this invention. Moreover, by minimizing the local stresses within the shallow trenches, the global stress on the wafer as a whole is minimized, thereby decreasing the tendency for the wafers to warp during subsequent processing.

A further aspect of this invention is the use of TEOS-$O_3$ deposition of a first layer of oxide, followed by the deposition of a second layer of CVD-oxide.

Another aspect of this invention is the deposition of multiple layers of TEOS-$O_3$/CVD oxide, wherein the entire shallow trench becomes filled with alternating, multiple layers of dielectric materials.

Another aspect of this invention is the formation of alternating layers of TEOS-$O_3$ and CVD oxide, wherein the thickness of the TEOS-$O_3$ layer is less than the thickness of the CVD oxide layer.

BRIEF DESCRIPTION OF THE FIGURES

The invention will be described with respect to the particular embodiments thereof. Other objects, features, and advantages of the invention will become apparent with reference to the specification and drawings in which.

DETAILED DESCRIPTION

Figure 1:
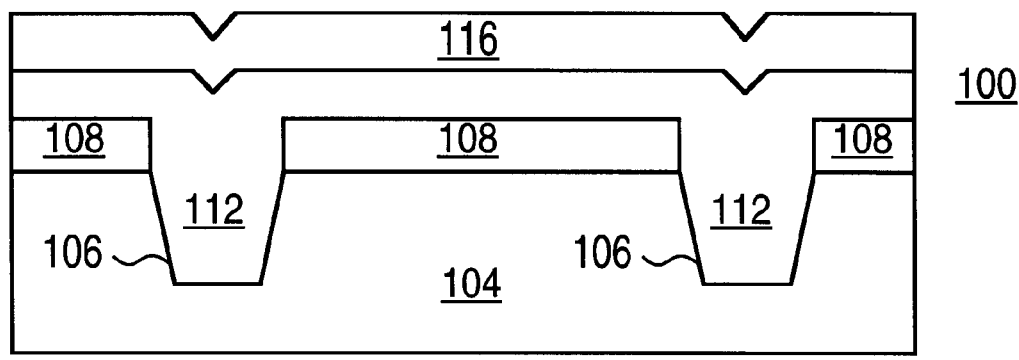
FIG. 1 is a drawing of a prior art STI filled with TEOS-$O_3$ and capped with a layer of HDPCVD oxide which does not extend within the trench.

This invention provides improved gap filling of shallow trenches with high-quality oxide dielectric materials, but the gap filling is accomplished without the creation of stress on either the semiconductor wafer as a whole, or on the internal structures of the shallow trenches. By reducing the mechanical stress within the trenches and between trenches, defects can be reduced, resulting in decreased source-drain short circuiting and in decreased trench—trench short circuiting. By decreasing the short circuiting, the functions of small dimension devices can be improved, making the manufacture of smaller semiconductor devices more practical.

In general, the reduction in local stress in the dielectric films of this invention is accomplished by depositing alternating layers of dielectric materials having either compressive stress or tensile stress characteristic of each type of dielectric layer. Tensile stress means a tendency for the thin film to contract in a direction parallel to the surface of the film. Compressive stress means a tendency for the thin film to expand in a direction parallel to the surface of the film. The different types of stress can result in different types of film defects. In a tensile film, where the film tends to contract, cracks can appear in the surface resulting in small voids or "pinpoint" defects. Conversely, in a compressive film, when the stress becomes sufficiently large to overcome the interatomic bonding of molecules in the film, the surface can buckle. Each pair of alternating TEOS-$O_3$ CVD/HDPCVD oxide layers is herein termed a "CVD oxide bilayer" or a "bilayer." By providing alternating layers of dielectric materials with compensating or opposite stresses, the total local stress on the dielectric film as a whole can be adjusted to any desired level. For certain applications, it is desirable to minimize the total stress of the dielectric material. This can be accomplished by adjusting the relative thicknesses of the alternating layers to compensate for differences in compressive or tensile stress of each layer.

By way of example only, a layer of TEOS $O_3$ CVD oxide has residual tensile stress and a layer of oxide deposited using HDPCVD methods has residual compressive stress. However, the magnitude of the stresses is not necessarily the same for different layers of dielectric material. The tensile stress of a layer of TEOS $O_3$ CVD oxide of a given thickness is greater than the compressive stress on a layer of HDPCVD oxide of the same thickness. Therefore, to minimize the total residual stress of a dielectric layer, it can be desirable to separately adjust the thicknesses of each layer to compensate for the differences. The creation of stress within a layer can be due to thermal expansion of the material comprising the material. The coefficient of thermal expansion a layer of TEOS $O_3$ CVD oxide is, in general, greater than the coefficient of thermal expansion of a layer of HDPCVD oxide. Thus, it can be desirable to manufacture a dielectric material having layers of HDPCVD oxide being about 3 times thicker than the layer of TEOS $O_3$ CVD oxide.

Generally, to manufacture STI, a silicon wafer is etched to produce the shallow trenches. After the trenches are formed, a layer of trench liner oxide can be formed using, by way of example only, dry oxidation or other methods known in the art. Dry oxidation can be carried out by exposing the wafer to $O_2$ at temperatures in the range of about 700° C to about 1050° C., or alternatively in the range of about 950° C to about 1050° C for a time sufficiently long to produce a layer of $SiO_2$ having a thickness in the range of about 50 Å to about 500 Å, or alternatively about 100 Å. A trench liner oxide can be used to overcome damage to the silicon substrate during etching the shallow trenches.

In one embodiment of this invention, to fill a STI gap 1000 Å in depth, it can be desirable to use a gap filling dielectric comprising a layer of TEOS $O_3$ CVD oxide about 300 Å thick, with a cap layer of HDPCVD oxide about 700 Å thick. This configuration can result in a low residual stress in the dielectric material as a whole. However, there can be stress remaining in each layer of the CVD oxide layers. Although this stress may not be reflected in a stress on the semiconductor wafer as a whole, the presence of stress within the different layers can result in the formation of small defects within the dielectric material.

Therefore, in another embodiment of this invention, to further decrease the residual stress in the dielectric material, multiple layers of CVD oxide can be deposited. By making each layer thinner, the residual stress is compensated over a shorter distance within the gap, thereby reducing the magnitude of the stress at the interfaces between the different layers. According to this embodiment of the invention, the TEOS $O_3$ CVD layer can be as thin as about 10 Å and the HDPCVD oxide layers can be as thin as about 30 Å in thickness. Thus, each bi-layer of TEOS $O_3$/HDPCVD oxide can have an overall thickness of about 40 Å. Thus, to build up a total layer of dielectric material 1000 Å in thickness, it is therefore desirable to provide about 25 CVD oxide bilayers. It is apparent that TEOS $O_3$ CVD oxide layers need not be as thin as about 10 Å, but can be within the range of about 10 Å to about 5000 Å in thickness. Alternatively, the TEOS $O_3$ CVD oxide layer can be in the range of about 100 Å to about 1000 Å, and in another embodiment, the TEOS $O_3$ CVD oxide layer can be about 500 Å in thickness.

The thickness of the corresponding layer of HDPCVD oxide can also be adjusted to compensate for the tensile strength of the TEOS $O_3$ CVD oxide layer. Thus, if the TEOS $O_3$ CVD oxide layer is 100 Å in thickness, the HDPCVD oxide layer can be about 300 Å in thickness to compensate for the tensile stress on the TEOS $O_3$ CVD oxide layer. Similarly, if the TEOS $O_3$ CVD oxide layer is about 5000 Å thick, the HDPCVD oxide layer can be about 15,000 Å thick. Moreover, other ratios of oxides can be used, depending upon the relative stresses inherent in the different types of oxides.

TEOS-$O_3$ CVD layers can have better coverage of a silicon substrate than HDPCVD layers. Thus, for some applications, it is desirable to deposit a TEOS-$O_3$ CVD layer directly on the silicon substrate surface or on a layer of liner oxide, if present, followed by deposition of an HDPCVD layer. In alternative embodiments, the order of the layers of oxide films can be reversed, wherein a first layer of HDPCVD is deposited and then a layer of TEOS-$O_3$ CVD oxide is deposited. Similarly, bilayers of HDPCVD/TEOS-$O_3$ CVD can be applied to reduce the stress of the oxide layer.

Embodiments of this invention are described below with reference to the Figures. In each Figure, like numbers refer to like elements.

Figure 2:
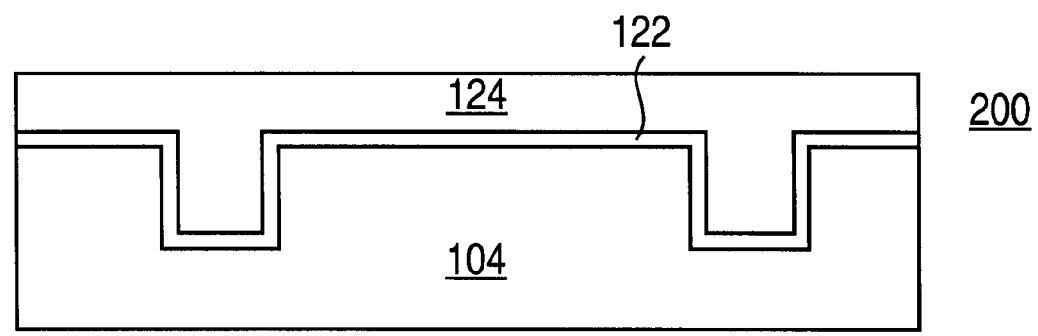
FIG. 2 is a drawing of a STI of this invention, wherein a thin layer of TEOS-$O_3$ is deposited within the shallow trench, and a thicker layer of HDPCVD oxide is deposited on top of the TEOS-$O_3$ layer.

FIG. 2 depicts an embodiment of the invention. Device 200 comprises silicon substrate 104, with shallow trenches 106 etched therein. A thin layer of first oxide 122 is conformal with the bottom and sidewalls of the shallow trench 106. First oxide layer 122 is deposited by the TEOS-$O_3$ CVD method as described above. A thicker layer of second oxide 124 is shown filling the remaining gap within the shallow trench 106. Second oxide 124 is deposited by the HDPCVD method as described above. After planarization, the surface oxide 124 is ready for further processing steps. Any number of subsequent manufacturing steps may be hereinafter performed in accordance with the art and are not described further.

Figure 3:
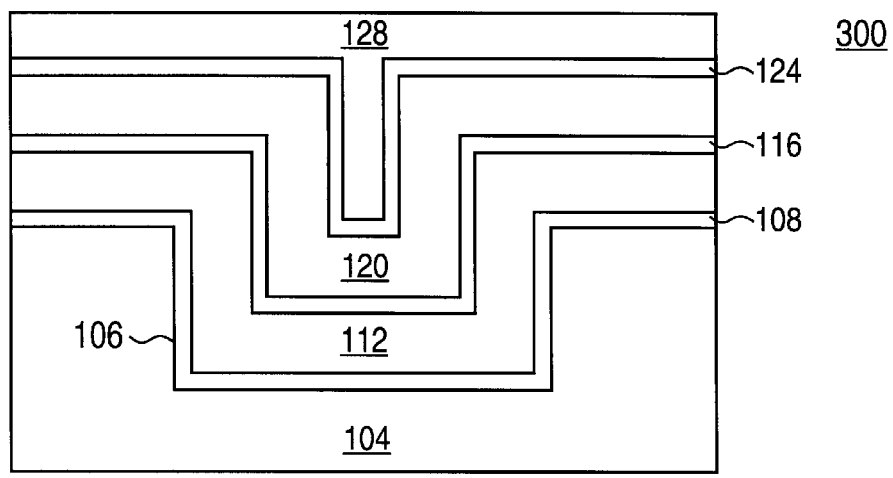
FIG. 3 is a drawing of a STI of this invention prior to planarization, wherein alternating layers of TEOS-$O_3$ and HDPCVD oxide are shown filling the shallow trench.

FIG. 3 depicts another embodiment of the invention, comprising multiple dielectric bilayers, prior to planarization. Device 300 comprises a silicon substrate 104 having a shallow trench 106 etched therein. A first, thin layer of first oxide 108 is shown conformal with the bottom and sides of the shallow trench 106. First oxide layer 108 is deposited by the TEOS-$O_3$ CVD method as described above. A thicker layer of a second oxide 112 is shown, conformal with the thin layer of first oxide 108. Second oxide layer is deposited by the HDPCVD method as described above. A second thin layer of the first oxide 116 is shown conformal with the bottom and sidewalls of the first layer of the second oxide 112. The second layer of the first oxide 116 is deposited by the TEOS-$O_3$ CVD method as described above for the first layer of first oxide. A second layer of the second oxide 120 is shown conformal with the bottom and sidewalls of the second layer of first oxide 116. The second layer of second oxide is deposited by the HDPCVD method as described above. A third layer of the first oxide 124 is shown, as is a top layer comprising a second oxide 128. The third layer of first oxide 124 is deposited by the TEOS-$O_3$ CVD method as described above for the first and second layers of first oxide.

Figure 4:
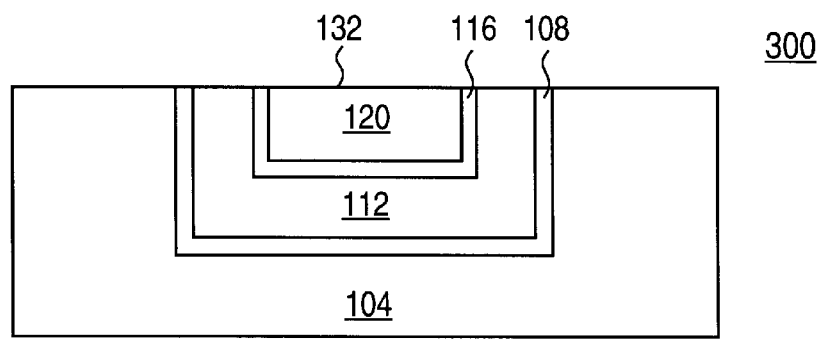
FIG. 4 is a drawing of a STI of this invention after planarization, showing the alternating layers of TEOS-$O_3$ and HDPCVD oxide.

FIG. 4 depicts the same portion of semiconductor wafer as shown in FIG. 3, except that the surfaces of substrate 104, and layers of oxide 108, 112, 116, and 120 have been planarized by chemical mechanical polishing, to result in a highly planar surface 132.

Figure 5:
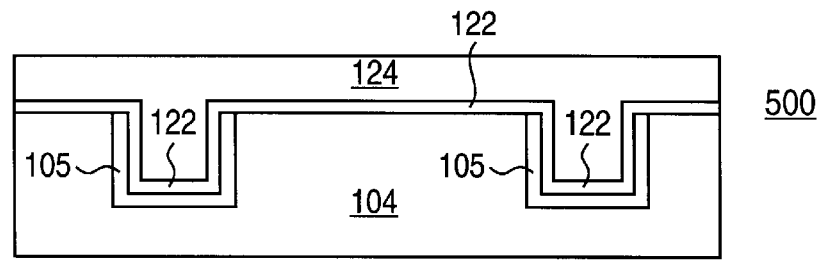
FIG. 5 is a drawing of a STI of this invention similar to that of FIG. 2, except that the shallow trench has a layer of trench liner oxide formed prior to the formation of alternating layers of TEOS-$O_3$ and HDPCVD oxide.

FIG. 5 depicts a portion of a semiconductor wafer 500 having shallow trenches lined with a layer of trench liner oxide 105, then having a layer of TEOS-$O_3$ CVD oxide 122 and a layer of HDPCVD oxide 124 deposited on the layer of TEOS-$O_3$ CVD oxide. The surface of the HDPCVD oxide layer 124 has been planarized.

It is understood that the several embodiments described herein are by way of example only and are not intended to be limiting to the scope of the invention. Other embodiments of the invention are possible and can be produced by those of ordinary skill in the art without undue experimentation. All of these alternative embodiments are considered part of this invention.

Industrial Applicability

The methods of this invention are useful for the manufacture of semiconductor devices having shallow isolation trenches having reduced mechanical stresses within and between the trenches. Reducing the mechanical stresses within and between the shallow isolation trenches, reduces the appearance of pinhole, buckling, and other types of stress-induced defects. The result are shallow trench isolations having reduced source-drain and trench—trench short circuiting. The decreased presence of stress-induced defects and decreased short circuiting enables the manufacture of semiconductor devices having increased device density and increased useful lifetimes.

We claim:

1. A method for providing a dielectric material having reduced stress in a shallow isolation trench on a semiconductor wafer, said method comprising the steps of:

depositing within said shallow isolation trench, a first layer of a dielectric material having tensile stress;

depositing upon said first layer within said shallow isolation trench, a second layer of a dielectric material having compressive stress; and heating said dielectric material having tensile stress and said dielectric material having compressive stress.

2. The method of claim 1, wherein said semiconductor wafer has a layer of trench liner oxide having a thickness of about 50 Å to about 500 Å formed thereon.

3. The method of claim 1, wherein said first layer of dielectric material is TEOS $O_3$ CVD oxide.

4. The method of claim 1, wherein said second layer of dielectric material is HDPCVD oxide.

5. The method of claim 1, wherein said first layer of dielectric material is HDPCVD oxide.

6. The method of claim 1, wherein said second layer of dielectric material is TEOS-$O_3$ CVD oxide.

7. The method of claim 1, wherein the heating step is carried out at a temperature of about 750° C to less than about 1200° C.

8. The method of claim 1, wherein the thickness of said second layer of dielectric material is selected to provide sufficient compressive stress to compensate for the tensile stress of said first layer of dielectric material.

9. The method of claim 1, wherein the thickness of said layer of dielectric material having tensile stress is in the range of from about 10 Å to about 5000 Å.

10. The method of claim 1, wherein the thickness of said layer of dielectric material having compressive stress is in the range of from about 30 Å to about 15,000 Å.

11. The method of claim 1, wherein the thickness of said layer of dielectric material having compressive stress is about 3 times the thickness of said layer of dielectric material having tensile stress.

12. A method for providing a dielectric material having reduced stress in a shallow isolation trench on a semiconductor wafer, said method comprising the steps of:

depositing within said shallow isolation trench, a bilayer comprising:
a first layer of a dielectric material having tensile stress; and
a second layer of a dielectric material having compressive stress;

wherein the composition of said first and second layers is selected to minimize the stress of said bilayer.

13. The method of claim 12, wherein said semiconductor wafer has a layer of trench liner oxide having a thickness of about 50 Å to about 500 Å formed thereon.

14. The method of claim 12, wherein said first layer of dielectric material has compressive stress and said second layer of dielectric material has tensile stress.

15. A method for providing a dielectric material having reduced stress within a shallow isolation trench on a semiconductor wafer, comprising the steps of:

providing a semiconductor wafer having a shallow trench thereon; and depositing within said shallow isolation trench, a plurality of bilayers, each bilayer comprising:
a first layer of a dielectric material having tensile stress; and
a second layer of a dielectric material having compressive stress;

and wherein each of said bilayers is selected to minimize the overall stress of said shallow isolation trench.

16. The method of claim 15, wherein said semiconductor wafer has a layer of trench liner oxide having a thickness of about 50 Å to about 500 Å formed thereon.

17. The method of claim 15, wherein said first layer of dielectric material has compressive stress and said second layer of dielectric material has tensile stress.

18. A method for providing a dielectric material having reduced stress in a shallow isolation trench on a semiconductor wafer, said method comprising the steps of:

depositing within said shallow isolation trench, a first layer of a dielectric material having tensile stress;

depositing upon said first layer within said shallow isolation trench, a second layer of a dielectric material having compressive stress; and heating said dielectric material, wherein the thickness of said second layer of dielectric material is selected to provide sufficient compressive stress to compensate for the tensile stress of said first layer of dielectric material.

19. The method of claim 18, wherein said semiconductor wafer has a layer of trench liner oxide having a thickness of about 50 Å to about 500 Å formed thereon.

20. The method of claim 18, wherein said first layer of dielectric material is TEOS $O_3$ CVD oxide.

21. The method of claim 18, wherein said second layer of dielectric material is HDPCVD oxide.

22. The method of claim 18, wherein said first layer of dielectric material is HDPCVD oxide.

23. The method of claim 18, wherein said second layer of dielectric material is TEOS-$O_3$ CVD oxide.

24. The method of claim 18, wherein the heating step is carried out at a temperature of about 750° C. to less than about 1200° C.

25. The method of claim 18, wherein the thickness of said layer of dielectric material having tensile stress is in the range of from about 10 Å to about 5000 Å.

26. The method of claim 18, wherein the thickness of said layer of dielectric material having compressive stress is in the range of from about 30 Å to about 15,000 Å.

27. The method of claim 18, wherein the thickness of said layer of dielectric material having compressive stress is about 3 times the thickness of said layer of dielectric material having tensile stress.

28. The method of claim 18, wherein said semiconductor wafer has a layer of trench liner oxide having a thickness of about 50 Å to about 500 Å formed thereon.

* * * * *